(12) United States Patent
Chen

(10) Patent No.: US 7,554,035 B2
(45) Date of Patent: Jun. 30, 2009

(54) LOCK MECHANISM FOR ROTATABLE COVER

(75) Inventor: Po-Wen Chen, Taipei (TW)

(73) Assignee: Inventec Corporation, Taipei (TW)

( * ) Notice: Subject to any disclaimer, the term of this patent is extended or adjusted under 35 U.S.C. 154(b) by 0 days.

(21) Appl. No.: 11/972,394

(22) Filed: Jan. 10, 2008

(65) Prior Publication Data

US 2009/0139281 A1    Jun. 4, 2009

(30) Foreign Application Priority Data

Nov. 30, 2007   (TW) .............................. 96145776 A

(51) Int. Cl.
    *H02G 3/14* (2006.01)
(52) U.S. Cl. .............................. 174/66; 174/67; 174/58; 174/50; 439/135; 361/686
(58) Field of Classification Search .................. 174/66, 174/67, 58, 53, 135, 50; 220/241, 242, 4.02; 439/135, 107; 361/686
    See application file for complete search history.

(56) References Cited

U.S. PATENT DOCUMENTS 5,779,083 A * 7/1998 Bordwell ..................... 220/242
5,808,860 A * 9/1998 Ohgami et al. .............. 361/680
5,931,336 A * 8/1999 Takeuchi ..................... 220/836
6,469,249 B2 * 10/2002 Capella ........................ 174/66
6,576,838 B2 * 6/2003 Matsumura .................. 174/66
6,593,531 B2 * 7/2003 Hülsmann et al. ............. 174/66
6,952,343 B2 * 10/2005 Sato ............................ 361/686
7,080,533 B2 * 7/2006 Sedley ......................... 70/276

* cited by examiner

Primary Examiner—Dhiru R Patel
(74) Attorney, Agent, or Firm—J.C. Patents

(57) ABSTRACT

A lock mechanism for a rotatable cover adapted for use with a case is disclosed. The rotatable cover includes a fastener and a first positioning portion. The lock mechanism includes a first fixing element and a first elastic member. The first fixing element has a locking hole for engagingly receiving the fastener. The first fixing element includes a first board, a second board positioned opposite to the first board, a connecting portion and a protrusion portion. A slot is formed between the first board and the second board. The connecting portion is disposed above the first board and the second board and connected to the protrusion portion. The protrusion portion includes a pivot shaft and a second positioning portion. The pivot shaft is inserted into a pivot portion of the case. The first elastic member is located between the first positioning portion and the second positioning portion.

14 Claims, 8 Drawing Sheets

US 7,554,035 B2

LOCK MECHANISM FOR ROTATABLE COVER

CROSS-REFERENCE TO RELATED APPLICATION

This application claims the priority benefit of Taiwan application serial no. 96145776, filed on Nov. 30, 2007. The entirety of the above-mentioned patent application is hereby incorporated by reference herein and made a part of this specification.

BACKGROUND OF THE INVENTION

1. Field of the Invention

The present invention relates to a lock mechanism, and more particularly, to a lock mechanism for a rotatable cover for covering an unused space in a case.

2. Description of Related Art

With the development of technology, electronic apparatus are being increasingly widely used in our current lives. Typically, electronic apparatus includes computers, servers, office machines, home appliances, communication and instrument devices. Various electronic devices and components of different function are incorporated into these electronic apparatus, thus providing the electronic apparatus with more and more function.

FIG. 1 illustrates a conventional server main unit and a cover structure. Referring to FIG. 1, the server unit 20 has a receiving space 30 for allowing a power supply to be inserted thereinto. A plurality of semiconductor devices and electronic components are disposed within the server unit 20. When no power supply is inserted into the receiving space 30, an unused opening is formed. To avoid external contaminations from entering into the server unit 20 via the unused opening 30 to contaminate and damage the server unit 20, a cover structure 10a is usually disposed on a surface of the main unit 20 that corresponds to the unused opening 30, thereby closing the unused opening 30 to avoid the external contaminations from entering the server unit 20.

In particular, the cover structure 10a is made into a metal box. The cover structure 10a is coupled to the server unit 20 by using a plurality of resilient metal tabs 14 formed on a part of box sides. In addition, a hole 12 is defined in one box side, which allows the user's finger to extend into the hole 12 to facilitate insertion and removal of the cover structure 10a with respect to the unused opening 30 of the server unit 20.

However, the cover structure 10a is coupled to the server unit 20 only by the resilient metal tabs 14. Therefore, the coupling force between the cover structure 10a and the main unit 20 may be insufficient and it is very likely that the cover structure 10a may become disengaged from the main unit 20 due to a shock or external force.

FIG. 2 illustrates another conventional cover structure. In this cover structure 10b, a resilient latching tab 16 is generally formed on a part of the box sides. A locking hole is formed on a surface of the server unit that corresponds to the unused opening, for allowing the resilient latching tab 16 of the cover structure 10b to be engaged in the locking hole of the server unit, thereby avoiding the external contaminations from entering the server unit via the unused opening.

In addition to the engagement of the resilient latching tab 16 in the locking hole, the conventional construction may also utilize screws to directly fasten the cover structure to the server unit (not shown) to avoid the disengagement due to a shock or external force. However, it can be difficult in inserting the resilient latch tab and troublesome in using the screws, which makes the cover structure inconvenience to operate and use.

What is needed, therefore, is a cover structure that can be tightly coupled to the unused opening and can be easily assembled at the same time.

SUMMARY OF THE INVENTION

The present invention is directed to a lock mechanism for a rotatable cover that is adapted for use with a case to cover an unused opening and that can be easily assembled.

The present invention provides a lock mechanism for a rotatable cover adapted for use with a case. The case includes a pivot portion. The rotatable cover includes a fastener and a first positioning portion. The lock mechanism for the rotatable cover includes a first fixing element and a first elastic member. The first fixing element has a locking hole for engagingly receiving the fastener. The first fixing element includes a first board, a second board, a connecting portion and a protrusion portion. The second board is positioned opposite to the first board with a slot being formed between the first board and the second board. The connecting portion is disposed above the first board and the second board, and connected to the protrusion portion. The protrusion portion includes a pivot shaft and a second positioning portion. The pivot shaft is configured to be inserted into the pivot portion of the case. The first elastic member is located between the first positioning portion and the second positioning portion.

According to one embodiment of the present invention, the rotatable cover has a first side portion and a second side portion, and the slot of the first fixing element receives a corner defined by the first side portion and the second side portion.

According to one embodiment of the present invention, a notch is defined in the corner.

According to one embodiment of the present invention, the first positioning portion is a protrusion formed on an inner wall of the notch.

According to one embodiment of the present invention, the fastener is a latch.

According to one embodiment of the present invention, the rotatable cover in a normal state covers and protects an unused opening of the case.

According to one embodiment of the present invention, the unused opening is further used as a module slot for receiving an electronic device, and when the electronic device is inserted into the module slot, the rotatable cover is opened by rotating the rotatable cover toward an interior of the module slot.

According to one embodiment of the present invention, the first elastic member is a compression spring.

According to one embodiment of the present invention, the first fixing element includes a first guide portion and a first passage, and the first guide portion is adapted for guiding the fastener along the first passage to insert into the locking hole.

According to one embodiment of the present invention, the lock mechanism for the rotatable cover further includes a second fixing element and a second elastic member, the second fixing element has a locking hole for engagingly receiving another fastener, the second fixing element is fastened between the rotatable cover and the case by the second elastic member, and the configuration of the second fixing element is the same as the configuration of the first fixing element.

According to one embodiment of the present invention, the second fixing element includes a second guide portion and a second passage, and the second guide portion is adapted for guiding another fastener along the second passage to insert into the locking hole.

According to one embodiment of the present invention, the second elastic member is a compression spring.

According to one embodiment of the present invention, the second elastic member comprises a torsion member that is disposed on each of two ends of the second elastic member and is fastened to the second fixing element.

According to one embodiment of the present invention, the first elastic member comprises a torsion member that is disposed on each of two ends of the first elastic member and is fastened to the first fixing element.

Since the present invention employs the lock mechanism for the rotatable cover, the rotatable cover in the normal state can cover and protect the unused opening to prevent the external contaminations from entering the case. In addition, since the first fixing element is fastened to the rotatable cover in a snap-fit manner and the first fixing element is pivotably connected between the rotatable cover and the case by the first elastic member, so that the lock mechanism can be tightly fastened to the rotatable cover and can be easily assembled.

In order to make the aforementioned and other features and advantages of the present invention more comprehensible, embodiments accompanied with figures are described in detail below.

DESCRIPTION OF THE EMBODIMENTS

Figure 1:
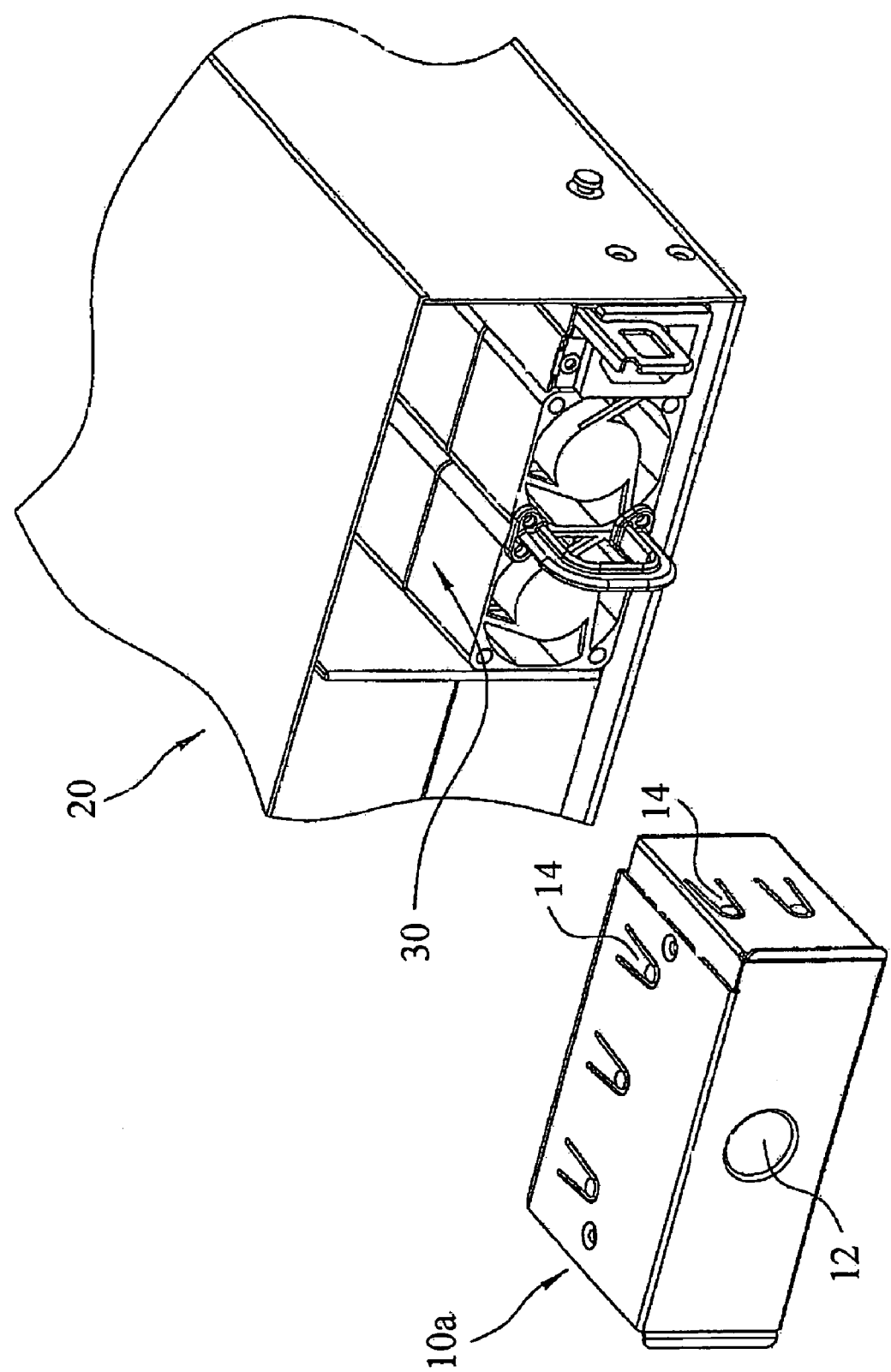
FIG. 1 illustrates a conventional server main unit and a cover structure.
Figure 2:
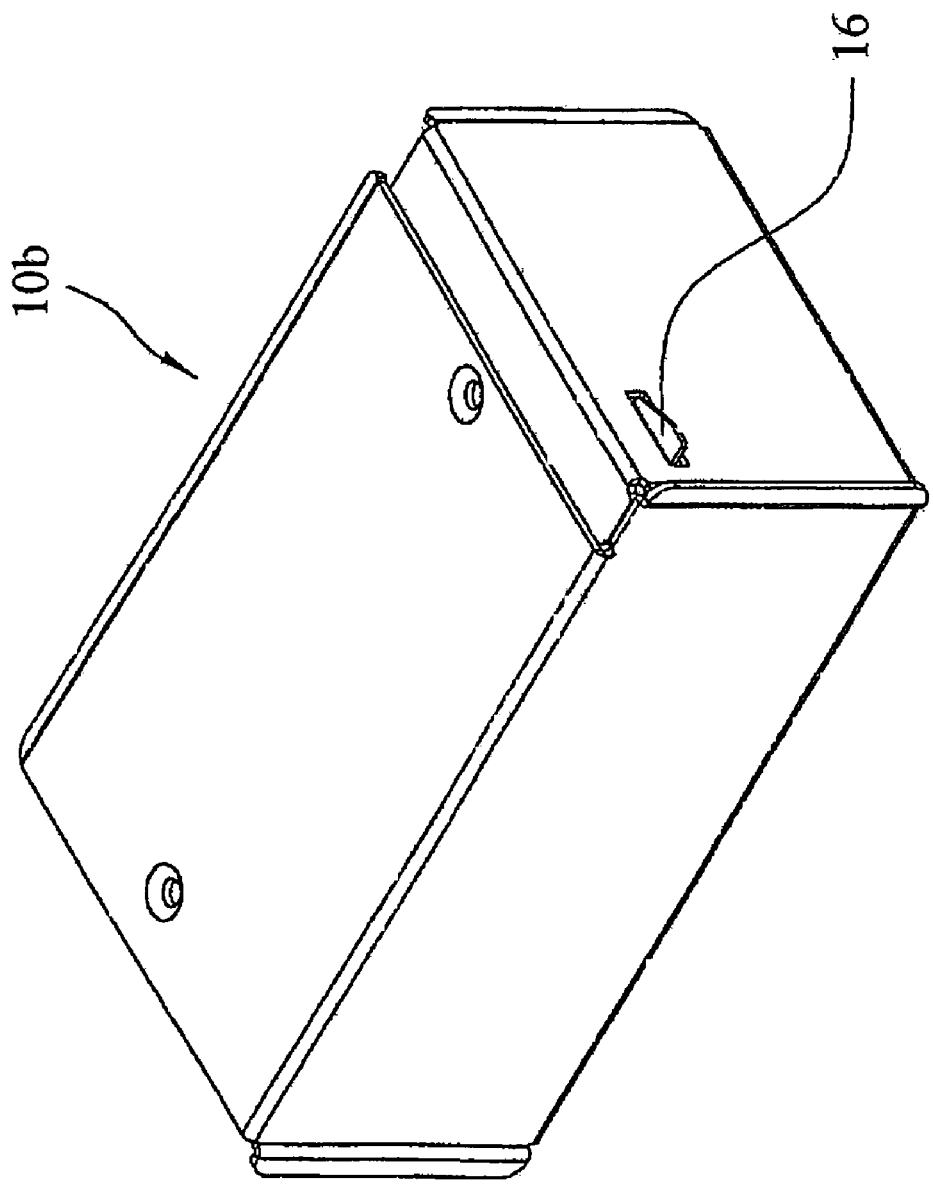
FIG. 2 illustrates another conventional cover structure.
Figure 3:
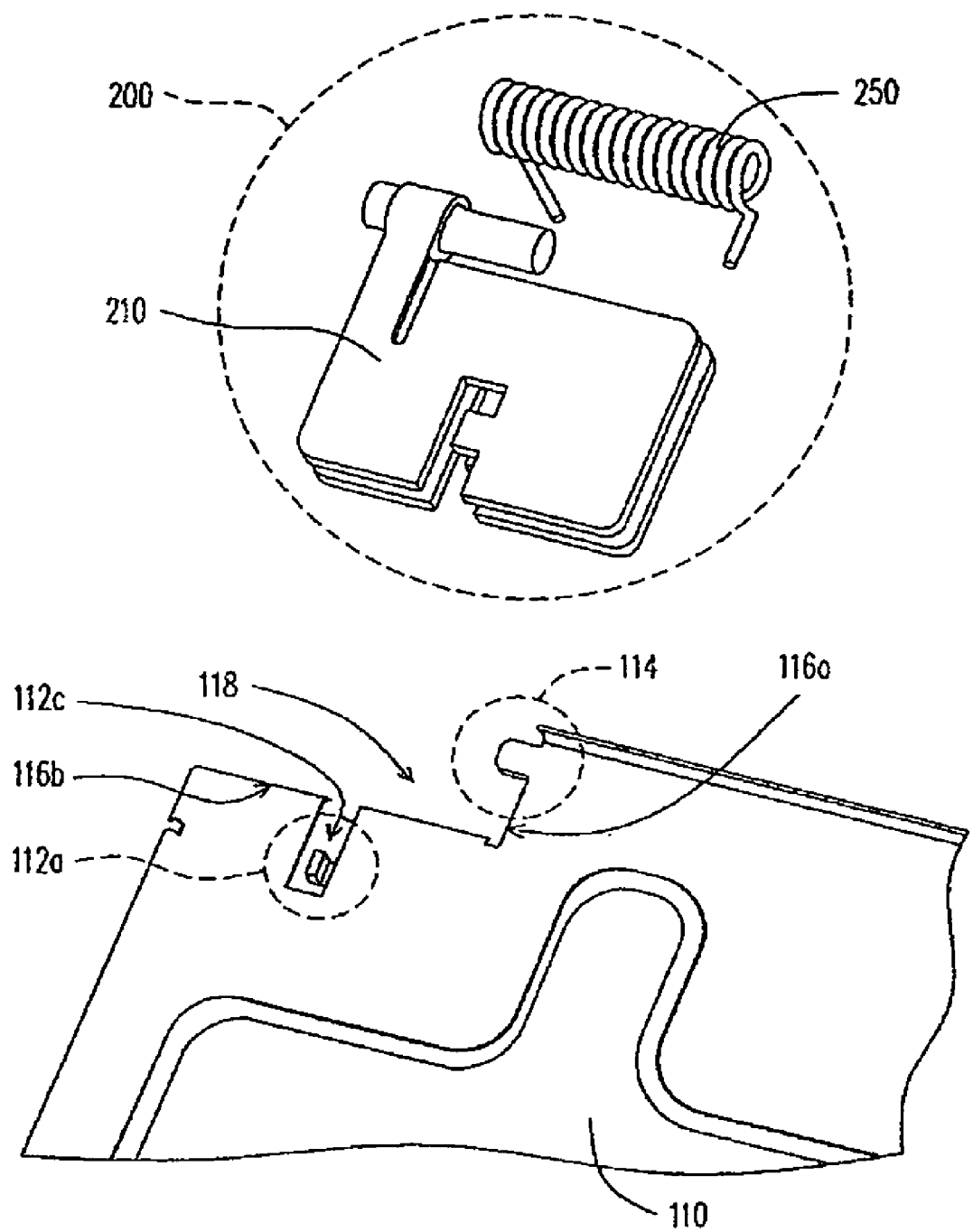
FIG. 3 illustrates an exploded view of a lock mechanism for a rotatable cover according to one embodiment of the present invention.

FIG. 3 illustrates an exploded view of a lock mechanism for a rotatable cover according to one embodiment of the present invention. Referring to FIG. 3, the lock mechanism 200 of the rotatable cover includes a first fixing element 210 and a first elastic member 250. The rotatable cover 110 includes a fastener 112a, a first positioning portion 114, a first side portion 116a and a second side portion 116b. The first side portion 116a and the second side portion 116b are intercrossed at a corner 118. In this embodiment, a notch is defined in the corner 118. In particular, the first positioning portion 114 is a protrusion formed on the first side portion 116a, and the fastener 112a includes a latch 112c.

Figure 4:
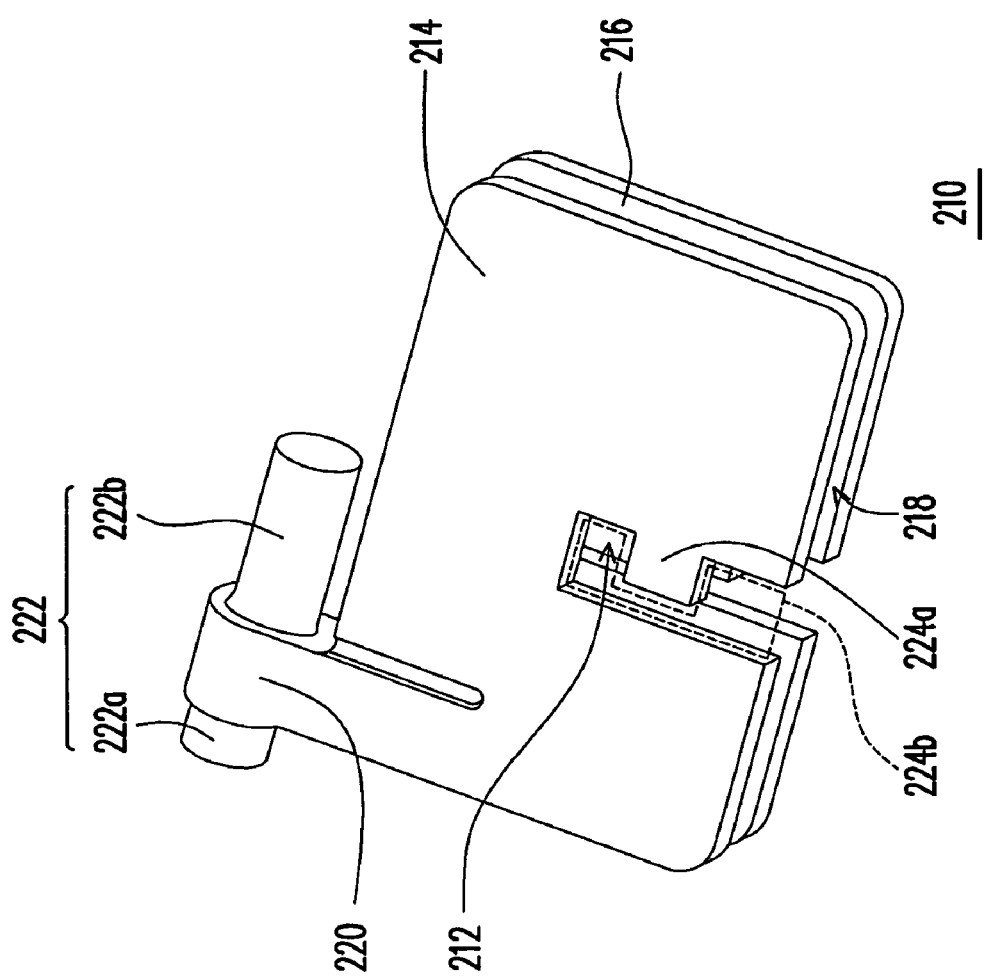
FIG. 4 is an enlarged view of the first fixing element of FIG. 3.

FIG. 4 is an enlarged view of the first fixing element of FIG. 3. Referring to FIGS. 3 and 4, the first fixing element 210 has a locking hole 212 for lockingly receiving the fastener 112a of the rotatable cover 110. The first fixing element 210 includes a first board 214, a second board 216, a connecting portion 220 and a protrusion portion 222. The first board 214 is positioned opposite to the second board 216, with a slot 218 being formed between the first board 214 and the second board 216.

Figure 5:
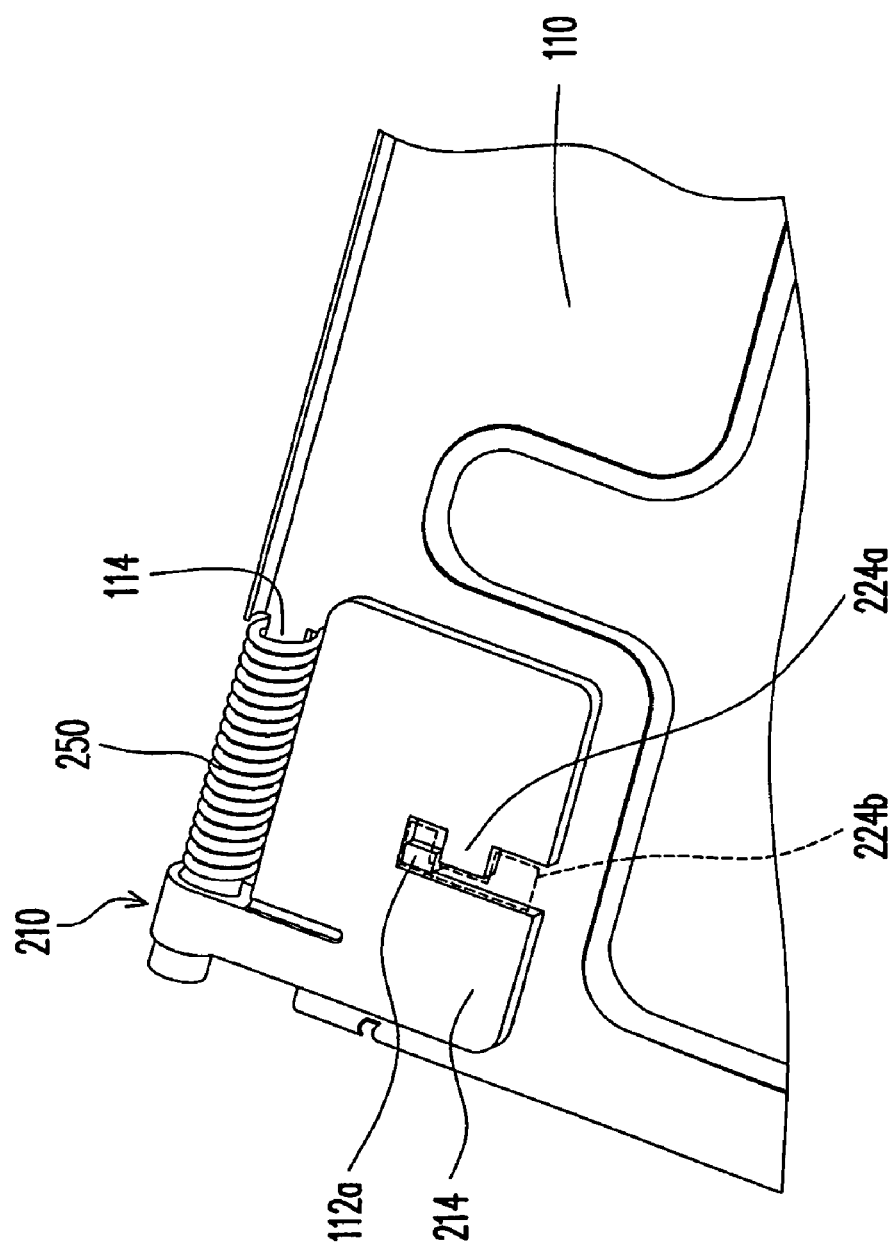
FIG. 5 is an assembled view of the lock mechanism for the rotatable cover.

In particular, FIG. 5 is an assembled view of the lock mechanism for the rotatable cover. Referring to FIGS. 4 and 5, the first fixing element 210 includes a first guide portion 224a and a first passage 224b. The first guide portion 224a is used to guide the fastener 112a of the rotatable cover 110 along the first passage 224b to insert into the locking hole 212 of the first fixing element 210, in which state, the rotatable cover 110 is inserted into the slot 218 of the first fixing element 210, with the first board 214 and the second board 216 being respectively disposed on opposite two sides of the rotatable cover 110.

It should be noted that the second board 216 is substantially the same as the first board 214 in material characteristics and shape. However, the structure of the second board 216 of the present invention is not limited to any particular structure. Rather, any known structure that can equally achieve the positioning function can be employed without departing from the spirit and scope of the present invention.

Referring to FIGS. 4 and 5, in the illustrated embodiment, the connecting portion 220 is positioned above the first board 214 and the second board 216 and is connected to the protrusion portion 222. The protrusion portion 222 includes a pivot shaft 222a and a second positioning portion 222b. The first elastic member 250 is positioned between the first positioning portion 114 and the second portioning portion 222b for maintaining the fastener 112a of the rotatable cover 110 and the locking hole 212 of the first fixing element 210 in a tightly locked state.

In particular, when the fastener 112a of the rotatable cover 110 is inserted along a left side of the first passage 224b into the first fixing element 210 under the guide of the first guide portion 224a, the first elastic member 250 is elastically compressed and the first fixing element 210 is pushed rightward, and then the first elastic member 250 will expand to restore from the compressed state to the state before deformation. It should be noted that the first elastic member 250 may be a compression spring 250. The first board 214, the second board 216, the connecting portion 220 and the protrusion portion 222 of the first fixing element 210 may be integrally formed, or may alternatively be formed into an integrated configuration by assembling two or more semi-finished structures, and may be made from metal or plastic.

Figure 6:
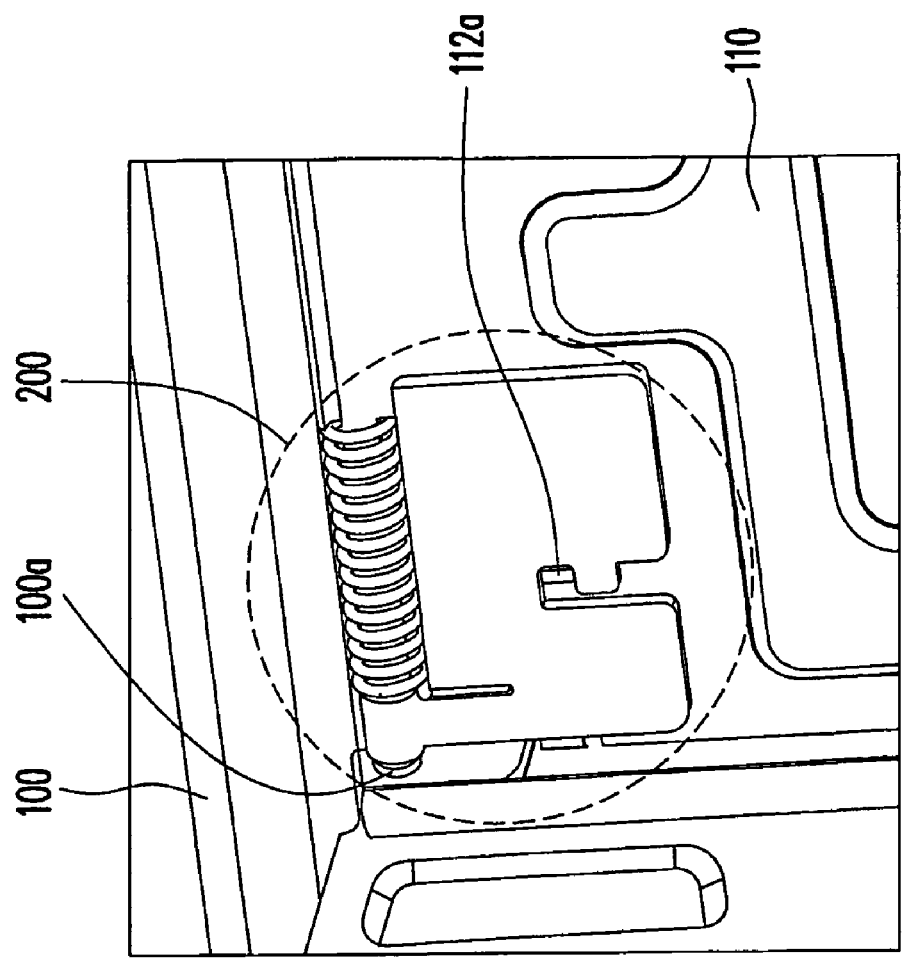
FIG. 6 is a partially enlarged view illustrating the lock mechanism of the rotatable cover of FIG. 3 utilized in a case.

FIG. 6 is a partially enlarged view illustrating the lock mechanism of the rotatable cover of FIG. 3 that is utilized in a case. Referring to FIGS. 4 and 6, the lock mechanism 200 of the rotatable cover of this embodiment is adapted for a case 100. The case 100 may be, for example, a server case that includes a pivot portion 100a. The pivot shaft 222a of the protrusion portion 222 is inserted into the pivot portion 100a of the case 100 to secure the first fixing element 210 between the rotatable cover 110 and the case 100.

In particular, when the fastener 112a of the rotatable cover 110 is inserted along a left side of the first passage 224b into the first fixing element 210 under the guide of the first guide portion 224a, the first fixing element 210 is pushed rightward, the first elastic member 250 is elastically compressed so that the pivot shaft 222a of the protrusion portion 222 is inserted into the pivot portion 100a of the case 100. After the pivot shaft 222a is inserted into the pivot portion 100a, the first elastic member 250 will expand to restore from the compressed state to the state before deformation. In other words, the horizontal distance the fastener 112a moves to engage into the locking hole 212 substantially equals to the length of the pivot shaft 222a of the protrusion portion 222.

Figure 7:
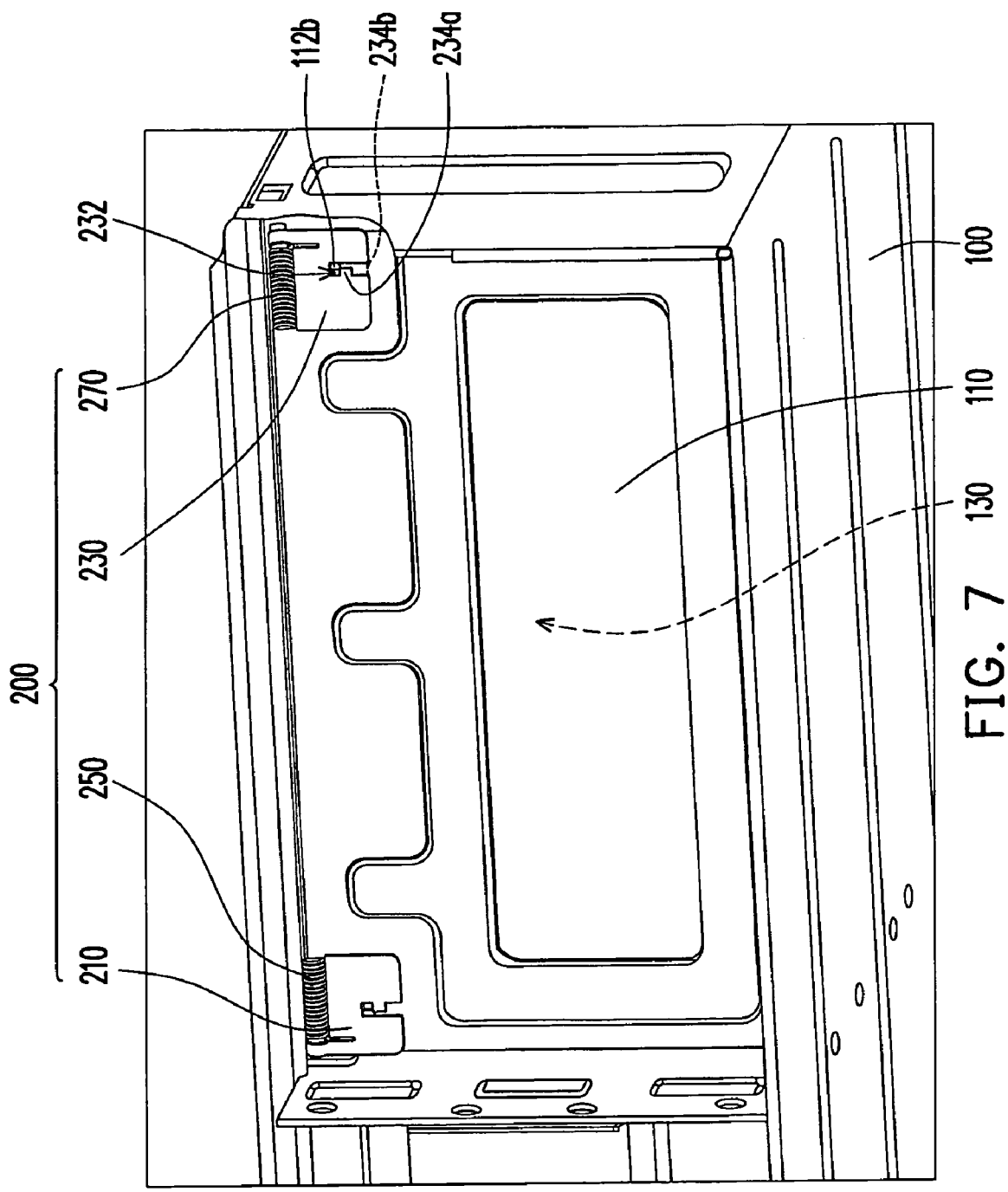
FIG. 7 illustrates the lock mechanism of the rotatable cover of FIG. 6 utilized in the case.

FIG. 7 illustrates the lock mechanism of the rotatable cover of FIG. 6 utilized in the case. Referring to FIG. 7, in the illustrated embodiment, the lock mechanism 200 of the rotatable cover further includes a second fixing element 230 and a second elastic member 270. The second fixing element 230 is positioned opposite to the first fixing element 210, and the first fixing element 210 and the second fixing element 230 are disposed on two ends of the rotatable cover 110, respectively. The second fixing element 230 has a locking hole 232 for lockingly receiving another fastener 112b of the rotatable cover. In particular, the second fixing element 230 and the first fixing element 210 have substantially the same configuration. Thus, the second fixing element 230 includes a second guide portion 234a and a second passage 234b. The second guide portion 234a is used to guide the fastener 112b of the rotatable cover 110 along the second passage 234b to insert into the locking hole 232 of the second fixing element 230.

In particular, the case 100 usually receives a plurality of semiconductor devices and electronic components, but typically has an opening 130 allowing for expansion during later use. The lock mechanism 200 of the rotatable cover is provided to prevent the external contaminations from entering the case 100 via the opening 130 to contaminate or damage the semiconductor devices and electronic components within the case 100. Therefore, the rotatable cover 110 positioned in a normal state can cover and protect the opening 130. In addition, the opening 130 may further be used as a module slot for receiving an electronic device. For example, the electronic device may be an accessory such as a cooling fan or power supply. When the electronic device is inserted into the module slot, the rotatable cover 110 is opened by rotating toward the interior of the module slot. Movement of the rotatable cover 110 in this manner facilitates the use of the opening 130 by a user without removing the rotatable cover, thus saving time.

Figure 8:
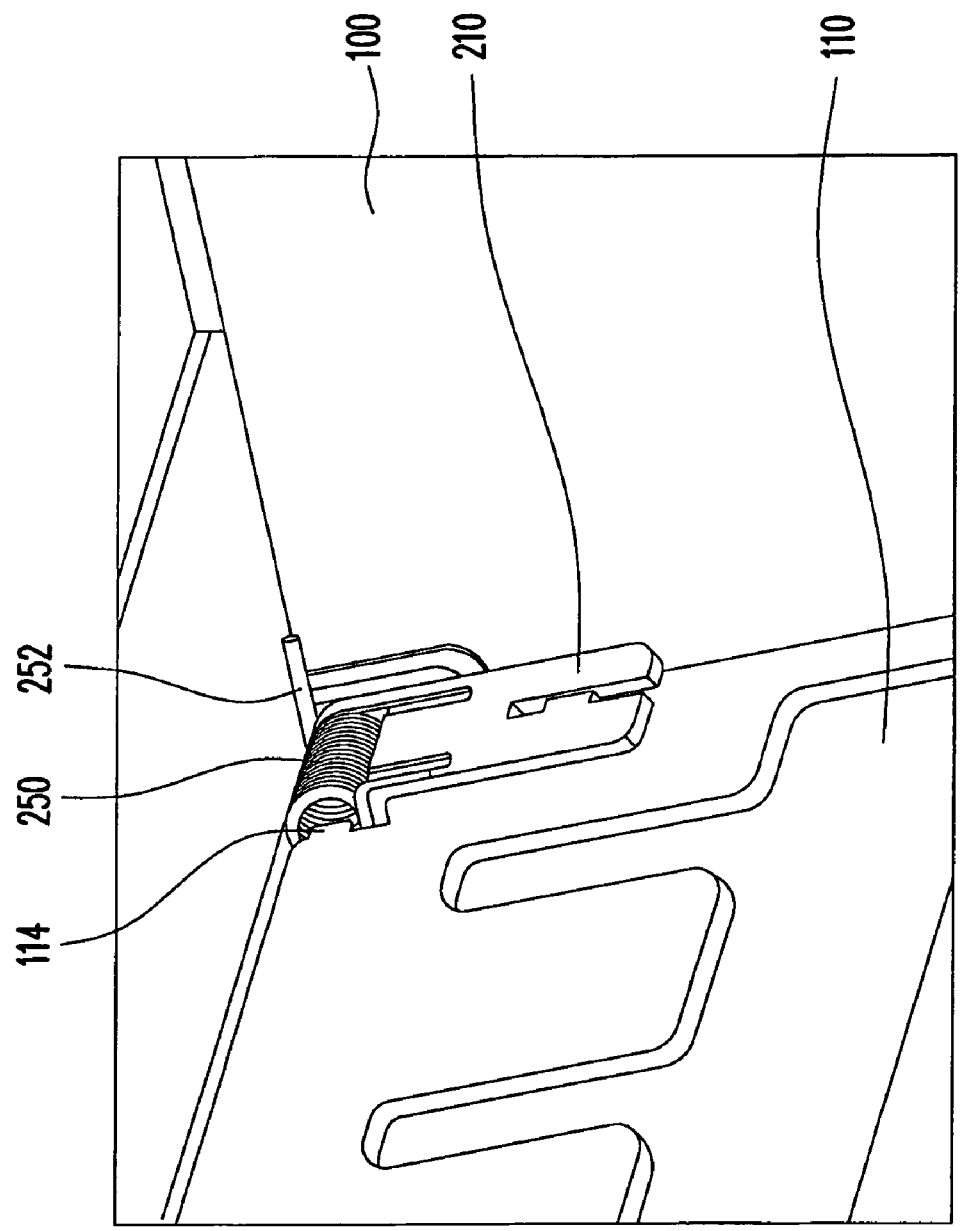
FIG. 8 is a partially enlarged back view illustrating the lock mechanism of the rotatable cover of FIG. 7 utilized in a case.

Furthermore, FIG. 8 is a partially enlarged back view illustrating the lock mechanism of the rotatable cover of FIG. 7 utilized in a case. Referring to FIGS. 7 and 8, the first elastic member 250 includes a torsion member 252 that is formed on each of two ends of the first elastic member 250 and is fastened to the first fixing element 210, the second elastic member 270 includes a torsion member (not shown) that is formed on each of two ends of the second elastic member 270 and is fastened to the second fixing element 230. The second elastic member 270 and the first elastic member 250 have substantially the same configuration and are both a compression spring with torsion members. The second fixing element 230 is fastened between the rotatable cover 110 and the case 100 by the second elastic member 270. In particular, the first elastic member 250 and the second elastic member 270 can restore the rotatable cover 110 to its original position with their torsion members. The first elastic member 250 and the second elastic member 270 cooperatively provides the resilient force under compression to enable the pivot shaft 222a to insert into the pivot portion 100a of the case 100.

In other words, with the lock mechanism 200 being fastened to the rotatable cover 110 and rotatably coupled to the case 100, the rotatable cover 110 can be opened by rotating the rotatable cover 110, and the torsion members 252 of the first elastic member 250 and the second elastic member 270 can restore the rotatable cover 110 such that the opening 130 of the case 100 can be closed by the rotatable cover 110 in the normal state to prevent the exterior contaminations from entering the case 100 via the opening 130 to contaminate or damage the semiconductor devices and electronic components within the case 100. When the opening 130 is to be used, the opening 130 can be quickly and easily opened. The illustrated embodiment can be utilized in various applications such as in servers, computers, office machines, home appliances, and communication and instrument devices.

In summary, the lock mechanism of the rotatable cover of the present invention is adapted for use with a case. The lock mechanism is fastened to the rotatable cover by the first fixing element. The pivot portion of the case is pivotably connected with the pivot shaft of the protrusion portion, and the first elastic member is latched between a first positioning portion and a second positioning portion such that the rotatable cover can be opened by rotating the rotatable cover. Therefore, in the normal state, the rotatable cover can cover and protect the unused opening to prevent the exterior contaminations from entering the case, and facilitate opening the unused opening for use. In addition, since the lock mechanism of the rotatable cover of the present invention is fastened to the rotatable cover in a snap-fit manner, the lock mechanism is tightly fastened to the rotatable cover, thus eliminating the need of using locking screws and facilitating the assembly thereof.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A lock mechanism for a rotatable cover, adapted for use with a case comprising a pivot portion, the rotatable cover comprising a fastener and a first positioning portion, the lock mechanism comprising:

a first fixing element having a first locking hole for engagingly receiving the fastener, comprising a first board, a second board, a connecting portion and a protrusion portion, the second board being positioned opposite to the first board with a slot being formed between the first board and the second board, the connecting portion being disposed above the first board and the second board and connected to the protrusion portion, the protrusion portion comprising a pivot shaft and a second positioning portion, the pivot shaft being configured to be inserted into the pivot portion of the case; and a first elastic member located between the first positioning portion and the second positioning portion.

2. The lock mechanism for the rotatable cover in accordance with claim 1, wherein the rotatable cover comprises a first side portion and a second side portion, and the slot of the first fixing element receives a corner defined by the first side portion and the second side portion.

3. The lock mechanism for the rotatable cover in accordance with claim 2, wherein a notch is defined in the corner.

4. The lock mechanism for the rotatable cover in accordance with claim 3, wherein the first positioning portion comprises a protrusion formed on an inner wall of the notch.

5. The lock mechanism for the rotatable cover in accordance with claim 1, wherein the fastener comprises a latch.

6. The lock mechanism for the rotatable cover in accordance with claim 1, wherein the rotatable cover in a normal state covers and protects an unused opening of the case.

7. The lock mechanism for the rotatable cover in accordance with claim 6, wherein the unused opening is further used as a module slot for receiving an electronic device, and when the electronic device is inserted into the module slot, the rotatable cover is opened by rotating the rotatable cover toward an interior of the module slot.

8. The lock mechanism for the rotatable cover in accordance with claim 1, wherein the first elastic member comprises a compression spring.

9. The lock mechanism for the rotatable cover in accordance with claim 8, wherein the first fixing element comprises a first guide portion and a first passage, and the first guide portion is adapted for guiding the fastener along the first passage to insert into the first locking hole.

10. The lock mechanism for the rotatable cover in accordance with claim 1, further comprising a second fixing element and a second elastic member, wherein the second fixing element comprises a second locking hole for engagingly receiving another fastener, the second fixing element is fastened between the rotatable cover and the case by the second elastic member, and the configuration of the second fixing element is the same as the configuration of the first fixing element.

11. The lock mechanism for the rotatable cover in accordance with claim 10, wherein the second fixing element comprises a second guide portion and a second passage, and the second guide portion is adapted for guiding the another fastener along the second passage to insert into the second locking hole.

12. The lock mechanism for the rotatable cover in accordance with claim 10, wherein the second elastic member comprises a compression spring.

13. The lock mechanism for the rotatable cover in accordance with claim 10, wherein the second elastic member comprises a torsion member that is disposed on each of two ends of the second elastic member and is fastened to the second fixing element.

14. The lock mechanism for the rotatable cover in accordance with claim 1, wherein the first elastic member comprises a torsion member that is disposed on each of two ends of the first elastic member and is fastened to the first fixing element.

* * * * *